BIPOLAR TRANSISTORS AND METHOD OF MANUFACTURE

Filed March 13, 1972 3 Sheets-Sheet 1

BIPOLAR TRANSISTORS AND METHOD OF MANUFACTURE

Filed March 13, 1972

3 Sheets-Sheet 3

United States Patent Office 3,756,861
Patented Sept. 4, 1973

3,756,861
BIPOLAR TRANSISTORS AND METHOD OF MANUFACTURE

Richard Steven Payne, Piscataway, N.J., and Robert John Scavuzzo, Bethlehem, Pa., assignors to Bell Telephone Laboratories, Incorporated, Murray Hill and Berkeley Heights, N.J.

Filed Mar. 13, 1972, Ser. No. 234,021
Int. Cl. H01l 7/54
U.S. Cl. 148—1.5 9 Claims

ABSTRACT OF THE DISCLOSURE

A bipolar transistor is fabricated by means of a two-step base formation and an emitter formed by chemical diffusion or ion implantation. One processing step in forming the base is either a diffusion or ion implantation of impurities which determines sheet resistivity. The other processing step is an ion implantation which determines doping concentration under the emitter. The resulting composite doping profile has a minimum and two peak values. The emitter is preferably implanted and then diffused to a depth which locates the emitter-base junction at or near the minimum of the base profile.

BACKGROUND OF THE INVENTION

This invention relates to the formation of bipolar transistors and in particular to transistors which are capable of operating at high frequencies, i.e., greater than 500 megacycles.

With the continuing development and future prospects of microwave communications systems, high speed memory and logic devices, as well as the need for low-level detectors and amplifiers for coaxial cable telephone transmission, great interest has been generated in a viable commercial process for fabricating high frequency transistors. At present, these transistors are formed by a double-diffusion process. That is, both emitter and base regions are formed by standard chemical diffusion techniques. Since the chemical diffusion process is difficult to control for transistors which require shallow structures or which require a narrow tolerance on transistor properties, ion implantation offers an attractive alternative doping process. The technique is capable of forming a wide range of impurity concentrations with a high degree of control of both the impurity concentration and its distribution. Thus, various attempts have been made to fabricate high frequency transistors utilizing ion implantation techniques, either in a double implant wherein both the emitter and base regions are implanted in the semiconductor substrate, or in a hybrid process wherein the base is implanted and the emitter diffused. These attempts, however, have not been successful in uniformly producing high gain, low leakage transistors.

SUMMARY OF THE INVENTION

In accordance with the invention, high frequency transistors are fabricated with improved gain characteristics and high yield. Base formation is accomplished by two separate processing steps whose order is interchangeable. In one step, a region of impurities is formed within a semi-conductor material by diffusion or ion implantation to determine the sheet resistivity and the surface concentration of the base region. In the other step, impurities are implanted within the same area of the semiconductor material but extend deeper into the bulk than the first region of impurities so that a base region is formed with an impurity profile which has a minimum and two peak values. The emitter region is formed by a chemical diffusion or by an ion implantation together with a thermal diffusion of the implanted impurities such that the emitter-base junction is located at or near the minimum in the base profile. The order of formation of the emitter and base regions is reversible.

DESCRIPTION OF THE DRAWING

These and other features of the invention will be delineated in detail in the description to follow. In the drawing.

DETAILED DESCRIPTION OF THE INVENTION

FIGS. 1A–1F best demonstrate the method of the present invention. It should be emphasized that these figures are not drawn to scale. Reference will also be made to FIGS. 2A–2D to demonstrate the impurity concentrations of the device at various stages of the process. While the manufacture of a discrete transistor is shown, it should be clear that the invention applies to the planar batch processing of several transistors on a semiconductor slice and to the manufacture of transistors as part of an integrated circuit.

Figure 1A:
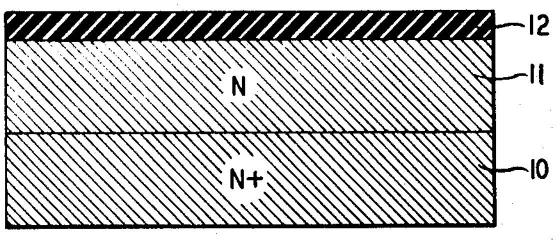
FIGS. 1A–1F are cross-sectional views of a device at various stages of manufacture in accordance with one embodiment of the invention.

In FIG. 1A, a silicon semiconductor substrate 10, of N+ conductivity type has grown thereon an an n-type epitaxial layer 11, by standard techniques. The substrate is preferably doped with Sb or As impurities to a resistivity of less than or equal to approximately .01 ohm-cm., while the n-type layer, which will comprise the collector region of the transistor, is preferably doped with As impurities to a resistivity of approximately 1 ohm-cm. although a range of .1–10 ohm-cm. is useful. The epitaxial layer 11, is approximately 7$\mu$ thick. A layer of silicon dioxide 12, is grown or deposited over the semiconductor material to a thickness of approximately 1400 A., although any oxide thickness would be useful so long as the ion implanted base dopants can still be implanted through the oxide.

Figure 1B:
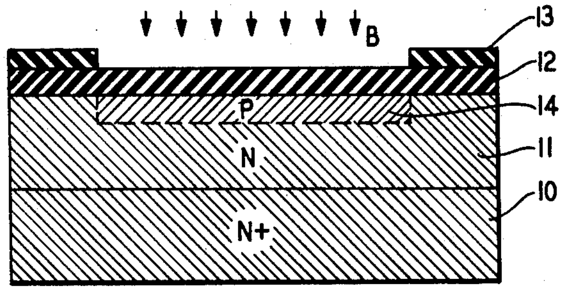

The area of the base region is defined by conventional photolithographic techniques. Thus, a layer of photoresist material is deposited over the silicon dioxide layer. The photoresist is exposed to light through a suitable mask, and then developed in a suitable solution so as to define a window in the photoresist for the introduction of base impurities into the semiconductor. This stage is illustrated in FIG. 1B, with the photoresist layer designated as 13. Alternatively, a deposited metal or insulator could be used as a mask in place of the photoresist.

Figure 2A:
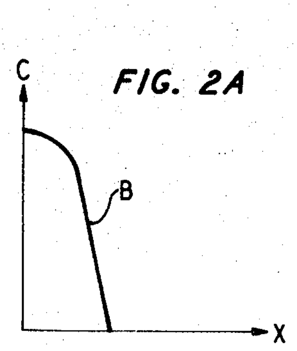
FIGS. 2A–2D are impurity profiles of a device at various stages of manufacture in accordance with the same embodiment.

Referring again to FIG. 1B, the first step in the formation of the base is illustrated. The structure is exposed to a beam of boron ions with an energy of approximately 50 kev. so that the boron penetrates the oxide layer, but not the photoresist, to form a region of p-type conductivity, 14, within the semiconductor layer 11 in the area defined by the photoresist window. The dose of the ion beam needed to give the desired sheet resistivity is approximately $2.8\times10^{14}$ ions/cm.$^2$, although a range of $10^{12}$–$5\times10^{14}$ ions/cm.$^2$ would be appropriate. The impurity profile resulting from the boron implant is illustrated in FIG. 2A, which is a sketch of impurity concentration C as a function of distance X from the top surface of the semiconductor material. The curve follows a Guassian distribution with a peak density of approximately $10^{19}$ ions/cm.$^3$ at a depth of approximately .02$\mu$. The energy of the ion beam must be sufficient to penetrate the oxide layer, but not so deep as to result, when combined with the succeeding steps, in an impurity concentration which is always decreasing past the initial peak density. This will be described in more detail below. An approximate energy range for this implant, predicated on an $SiO_2$ thickness of 1400 A., is 5–100 kev. It should be noted that this region, 14, may also be formed by standard diffusion techniques.

Figure 1C:
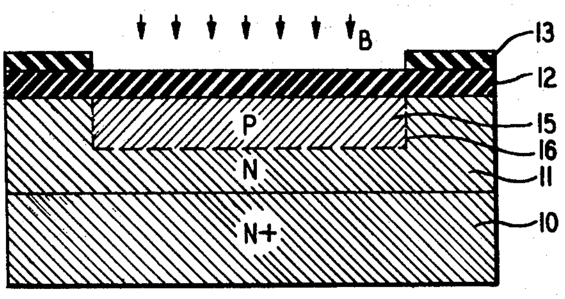

Referring now to FIG. 1C, the second step in the base formation is illustrated. Here, boron ions are again implanted in the region defined by the photoresist window. This implant, however, ultimately determines the doping concentration under the emitter and is usually less than the dosage described in the previous step. In this embodiment, a dosage of $8\times10^{12}$ ions/cm.$^2$ was utilized, although a range of $8\times10^{11}$–$5\times10^{13}$ ions/cm.$^2$ is useful. The energy of the implanted ions must be sufficient to inject the ions deeper into the bulk than the ions of the previous step, resulting in the composite p-type base region 15, with the collector-base junction indicated by dashed line 16. In this particular embodiment, the energy of the boron beam was approximately 250 kev. An appropriate range of energy for this implant, predicated on an $SiO_2$ thickness of 1400 A., is 100–400 kev.

Figure 2B:
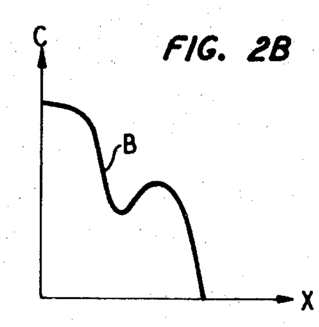

FIG. 2B illustrates the composite doping impurity profile resulting from the two boron implants. The peak density of the lower concentration boron implant is approximately $3\times10^{17}$ ions/cm.$^3$ and lies at a depth of approximately .5$\mu$. It is important to note that the impurity concentration must comprise two distinct peak values and a minimum value. Thus the energy of the two implants must be chosen so that the impurity distributions overlap to prevent formation of an n-region between the two implants, however, the impurity distributions must not overlap to the extent that no minimum is formed in the area of overlap. Putting it another way, in the area where the higher concentration impurity distribution (shallow implant) overlaps the lower concentration distribution (deep implant), the sum of the distributions must be less than the peak density of the lower concentration implant. Thus, the profiles intersect at a point where the impurity concentration of each implant is less than one-half of the peak concentration of the second implant.

It should be noted that the order of base implantation is reversible and therefore the designation of the implant determining sheet resistivity and the implant determining doping under the emitter as the first and second steps of the process is for illustrative purposes only.

Following the formation of the base, the photoresist is stripped off and approximately 5500 A. of additional insulating material is deposited over the $SiO_2$ layer. This layer will serve to reduce the stray capacitance from subsequent contacting electrodes and acts as the mask for the subsequent emitter formation. The insulator is densified at approximately 900° C. for ½ hour, and this treatment also serves to anneal any damage to the semiconductor caused by the base implantations. This anneal step may be deleted if densification of the deposited insulator is not needed for good quality emitter window definition. It will be appreciated by those skilled in the art that during this and subsequent heat treatments, the base profile will spread slightly. At the concentrations and temperatures involved, however, this effect is not significant, and for purposes of illustrating individual processing steps this phenomenon has been ignored in the profile figures. Means for calculating the distribution of boron as a function of temperature and time are well known in the art and hence the precise effect of annealing treatments may be found if desired. All requirements for impurity profiles more strictly refer to the profiles after all heat treatments.

The emitter window is then defined by photolithographic techniques similar to those described in reference to formation of the base region. Here, however, a window is etched through the deposited insulator and initial oxide layers down to the silicon surface and the photoresist is removed prior to implantation. Alternatively, the etching may be halted before the silicon surface is reached, leaving some residual oxide, or insulator-oxide, in the etched area. The unetched portion of the insulator-oxide layers serves as a mask in the subsequent implantation.

Figure 1D:
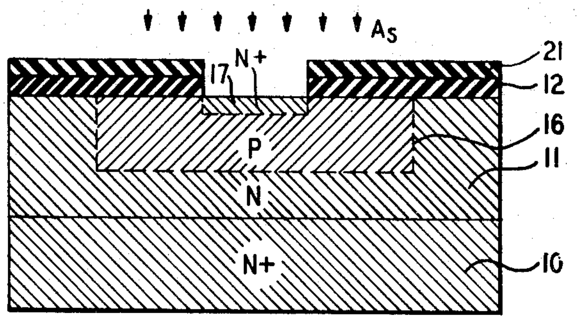
Figure 1E:
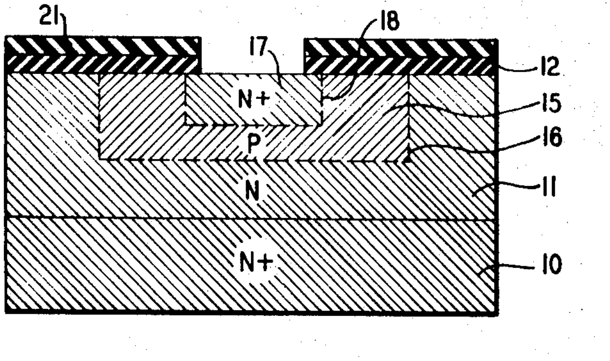
Figure 2C:
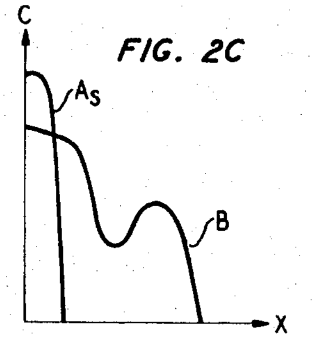

As shown in FIG. 1D, with the additional insulator designated as 21, the device is then bombarded by a beam of arsenic ions which forms a region of N+ conductivity type, 17, in the exposed area of the semiconductor. The dose in this example is $2\times10^{16}$ ions/cm.$^2$ and the energy of the beam is 150 kev. The dosage of this implant must be sufficiently high so that the n-type impurity distribution compensates for the p-type impurities which were introduced by the high concentration boron implant. An approriate range is therefore $10^{14}$–$5\times10^{16}$ ions/cm.$^2$. The energy is chosen so that the peak density of the As impurity distribution lies near the surface of the semiconductor, i.e., at a depth of approximately .01 to .2$\mu$. Energies may therefore be chosen in the range of 30–450 kev. The impurity profile at this stage in the processing is illustrated in FIG. 2C. In this example, peak density of the emitter is approximately $10^{21}$ ions/cm.$^3$ and is located at a depth of approximately .07$\mu$.

The emitter region is then annealed at a temperature and time sufficient to diffuse the arsenic impurities further into the bulk of the material such that the emitter-base junction is located at or near the minimum of the base profile. This is illustrtaed in FIG. 1E, with the emitter-base junction represented by dashed line, 18, and in FIG. 2D. In particular, FIG. 2D indicates the latitude in junction depth which will still produce optimum gain and frequency response. This latitude in depth, which is represented by $\Delta x$, extends from the minimum in the base profile to the peak of the deeper, lower concentration base implant. Since compensation by the emitter impurities of all impurities from the shallow, higher concentration base implant is desirable, the junction should preferably not be placed on the shallow side of the minimum for best results.

The anneal was performed at 1000° C. for ½ hour. The anneal may be performed within a range of temperature of 900–1300° C. for five minutes to three hours. It will be noted in reference to FIG. 2D that by diffusing the arsenic impurities, a very abrupt profile is formed. This effect is well known and is due primarily to the fact that the diffusion constant of arsenic is higher at high concentrations than it is at low concentrations. Sb or P could also be used for the emitter impurity, but the profile formed would not be as abrupt. Furthermore, the same sort of profile could be attained if the emitter impurities were introduced into the semiconductor by standard chemical diffusion techniques, i.e., without the initial surface implant. However, the implantation technique provides better control of the impurity distribution since it is not dependent on surface conditions or the vicissitudes of a chemical diffusion process. It should be understood that the emitter region may be formed prior to, as well as after, the formation of the base region.

Figure 1F:
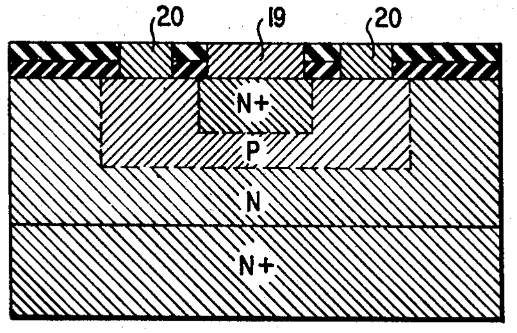

In the final steps, windows are etched through the insulating layers to expose the base region, and metal contacts 19 and 20 are formed by standard techniques to contact the emitter and base regions respectively as illustrated in FIG. 1F.

Figure 3:
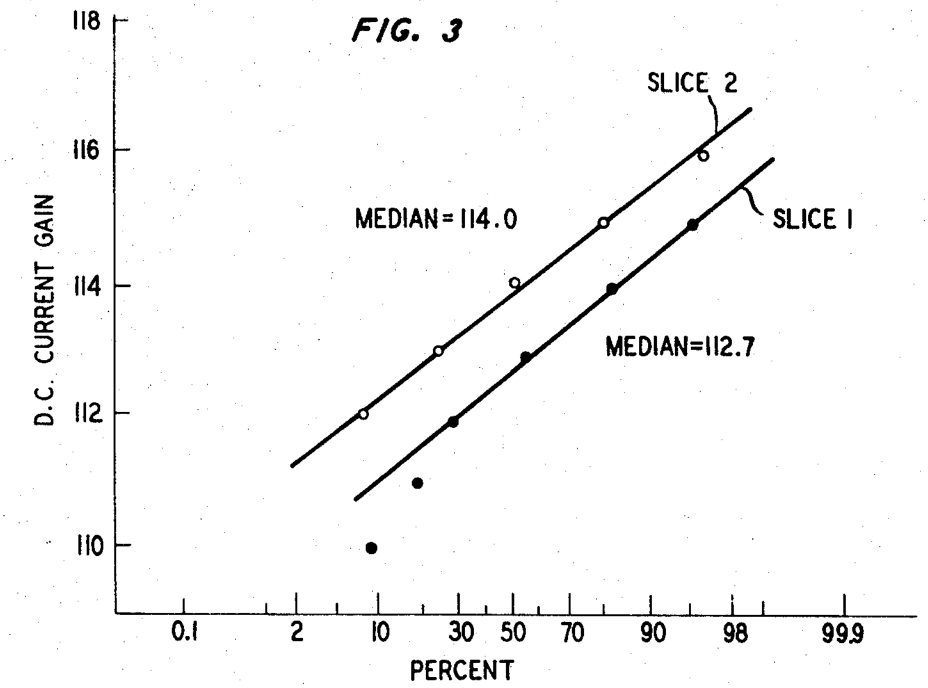
FIG. 3 is a plot of the distribution of DC current gain for several devices manufactured in accordance with the same embodiment.

The uniformity and high gain characteristics achieved by this process can be seen in reference to FIG. 3. This is a plot showing distributions of current gain for several devices batch-processed according to the above-described process on two different slices of semiconductor material. Twenty-two devices from slice 1 and twenty-five devices from slice 2 were tested. The graph reveals a remarkable consistency from device-to-device and slice-to-slice. The deviation in median current gain of the two slices and the standard deviation in current gain among devices on a slice was only 1.3. This represents a variation of less than 1.2% of the median. Other transistor properties, such as the grounded-emitter cutoff frequency and base-emitter voltage at fixed collector current, are similarly very uniform. Furthermore, current gain is nearly independent of collector current from 10 μa. to 100 na.

Figure 2D:
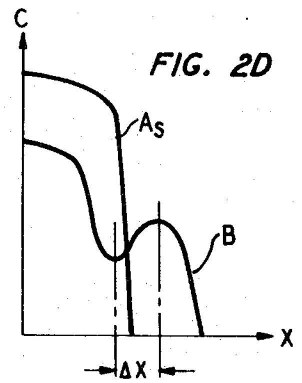

This high degree of uniformity is apparently due to the shape of the base profile and the positioning of the emitter junction as illustrated in FIG. 2D. Current gain is primarily dependent upon the total doping in the base under the emitter (the area of the base curve to the right of the As profile in FIG. 2D). Since the emitter-base junction is located in the area of small base concentration, shifting the location of the junction between minimum and peak density of the second implant results in only a relatively small change in doping under the emitter as compared to prior art diffused or implanted bases where no minimum is formed and the junction lies at a significantly higher base concentration.

Various additional modifications will become apparent to those skilled in the art. All such variations and extensions which basically rely on the teachings through which this invention has advanced the art are properly considered within the spirit and scope of the invention.

What is claimed is:

1. A method of fabricating a transistor comprising the steps of:

forming within a semiconductor body of one conductivity type a first region of impurities of opposite conductivity type;

exposing said body to an ion beam of impurities of said opposite conductivity type so as to form a second region of impurities of opposite conductivity type therein over the area of the first region but with a peak density extending deeper into said body than the peak density of the first region, said first and second regions of impurities overlapping to form a composite region of impurities comprising the base region which has a minimum impurity density at a depth between the two peak densities; and forming within the semiconductor body within the area defined by said base region an emitter region of impurities of said one conductivity type to a depth which is between the two peak densities of said base region.

2. The method according to claim 1 wherein the first region is formed by exposing said body to an ion beam of impurities of said opposite conductivity type.

3. The method according to claim 2 wherein the ion beam comprises boron ions at a dose of $10^{12}$–$5\times10^{14}$ ions/cm.$^2$ and energies in the range 5–100 kev.

4. The method according to claim 1 wherein the emitter region is formed by exposing said body to an ion beam of impurities of said one conductivity type and subsequently heating said body to diffuse the impurities further into the bulk of the body.

5. The method according to claim 4 wherein the impurities are selected from the group consisting of As, P, and Sb.

6. The method according to claim 4 wherein the ion beam comprises As ions at a dose of $10^{14}$–$5\times10^{16}$ ions/cm.$^2$ and energies in the range 30–450 kev.

7. The method according to claim 4 wherein the body is heated to a temperature in the range 900–1300° C. for a time in the range 5 minutes to 3 hours.

8. The method according to claim 1 wherein the emitter region is formed to a depth which is between the minimum impurity density and the deeper peak density of said base region.

9. The method according to claim 1 wherein the ion beam comprises boron ions at a dose of $8\times10^{11}$–$5\times10^{13}$ ions/cm.$^2$ and energies in the range 100–400 kev.

References Cited

UNITED STATES PATENTS

| | | | |
|---|---|---|---|
| 3,260,624 | 7/1966 | Wiesner | 148—175 |
| 3,483,443 | 12/1969 | Mayer et al. | 317—234 |
| 3,589,949 | 6/1971 | Nelson | 148—1.5 |
| 3,655,457 | 4/1972 | Duffy et al. | 148—1.5 |

L. DEWAYNE RUTLEDGE, Primary Examiner

J. M. DAVIS, Assistant Examiner

U.S. Cl. X.R.

148—187; 317—234 R, 235 R